United States Patent
Jenkins et al.

(10) Patent No.: US 10,317,434 B2
(45) Date of Patent: Jun. 11, 2019

(54) CONNECTION CABLE WITH VOLTAGE LEVEL INDICATOR

(71) Applicant: Western Digital Technologies, Inc., Irvine, CA (US)

(72) Inventors: Dean Mitcham Jenkins, La Canada-Flintridge, CA (US); Charles A. Neumann, Lake Forest, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 231 days.

(21) Appl. No.: 15/198,842

(22) Filed: Jun. 30, 2016

(65) Prior Publication Data

US 2018/0003743 A1  Jan. 4, 2018

(51) Int. Cl.
| | |
|---|---|
| *G01R 19/00* | (2006.01) |
| *G01R 19/165* | (2006.01) |
| *G06F 1/28* | (2006.01) |
| *G01R 13/02* | (2006.01) |

(52) U.S. Cl.
CPC ..... *G01R 19/0084* (2013.01); *G01R 13/0281* (2013.01); *G01R 19/1659* (2013.01); *G06F 1/28* (2013.01)

(58) Field of Classification Search
CPC ............ G01R 19/0084; G01R 13/0281; G01R 19/1659; G06F 1/28
USPC ........................................................ 324/126
See application file for complete search history.

(56) References Cited

U.S. PATENT DOCUMENTS

| | | | |
|---|---|---|---|
| 6,639,412 B1 | 10/2003 | Truett | |
| 8,559,996 B2* | 10/2013 | Lehr | .......... G05F 1/66 455/402 |
| 8,918,549 B2 | 12/2014 | Waters | |
| 9,619,979 B1* | 4/2017 | Montero | .............. H01R 13/641 |
| 2007/0152718 A1 | 7/2007 | Li | |
| 2013/0115803 A1 | 5/2013 | Tang et al. | |
| 2013/0290765 A1* | 10/2013 | Waters | .................... G06F 1/263 713/340 |
| 2014/0080353 A1 | 3/2014 | Ku et al. | |
| 2014/0285133 A1 | 9/2014 | Toledo et al. | |
| 2016/0055725 A1 | 2/2016 | Kreiner et al. | |

FOREIGN PATENT DOCUMENTS

CN  203607564 U  * 11/2013  ............. H01R 11/11

OTHER PUBLICATIONS

Espacenet translate CN203607564U.*
International Search Report and Written Opinion for PCT/US2017/019987 dated Jan. 1, 2019.

(Continued)

*Primary Examiner* — Melissa J Koval
*Assistant Examiner* — Courtney G McDonnough
(74) *Attorney, Agent, or Firm* — Chang & Hale LLP

(57) ABSTRACT

Systems and methods are disclosed for determining an input voltage level of an input voltage received by a connection cable. A monitoring component may determine whether the input voltage level matches one of a plurality of voltage levels. The connection cable may include an indicator component that may indicate which of the plurality of voltage levels matches the input voltage level.

18 Claims, 6 Drawing Sheets

(56) References Cited

OTHER PUBLICATIONS

User Manual: "Power Bank capacity tester User Manual Performance Parameters", pp. 1-2 XP055368553; https://cdn.solarbotics.com/products/datasheets/kcx-017 power bank testing.pdf.
Maxim: "ICL7665 Microprocessor Voltage Monitor with Dual Over/Undervoltage Detection", Nov. 30, 2015, XP055368771; https://www.maximintegrated.com/en/ds/ICL7665.pdf.

* cited by examiner

CONNECTION CABLE WITH VOLTAGE LEVEL INDICATOR

BACKGROUND

Field

The present disclosure generally relates to connection cables. More specifically, the present disclosure relates to connection cables with a voltage level indicator.

Description of Related Art

Computing devices (e.g., laptop computers, tablet computers, smartphones, digital cameras, etc.) may communicate data with each other using various interfaces. For example, computing devices may be coupled together via a connection cable (e.g., a universal serial bus (USB) cable). The connection cable may be coupled to respective direct-access interfaces (e.g., ports, such as USB ports) of the computing devices. The computing devices may communicate data via the connection cable and their respective direct-access interfaces. Computing devices may also receive power (e.g., an input voltage) from a power source via the connection cable. For example, a first computing device may receive power from a second computing device via the connection cable. In another example, the first computing device may receive power from a power source (e.g., a power adaptor) via the connection cable.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1:
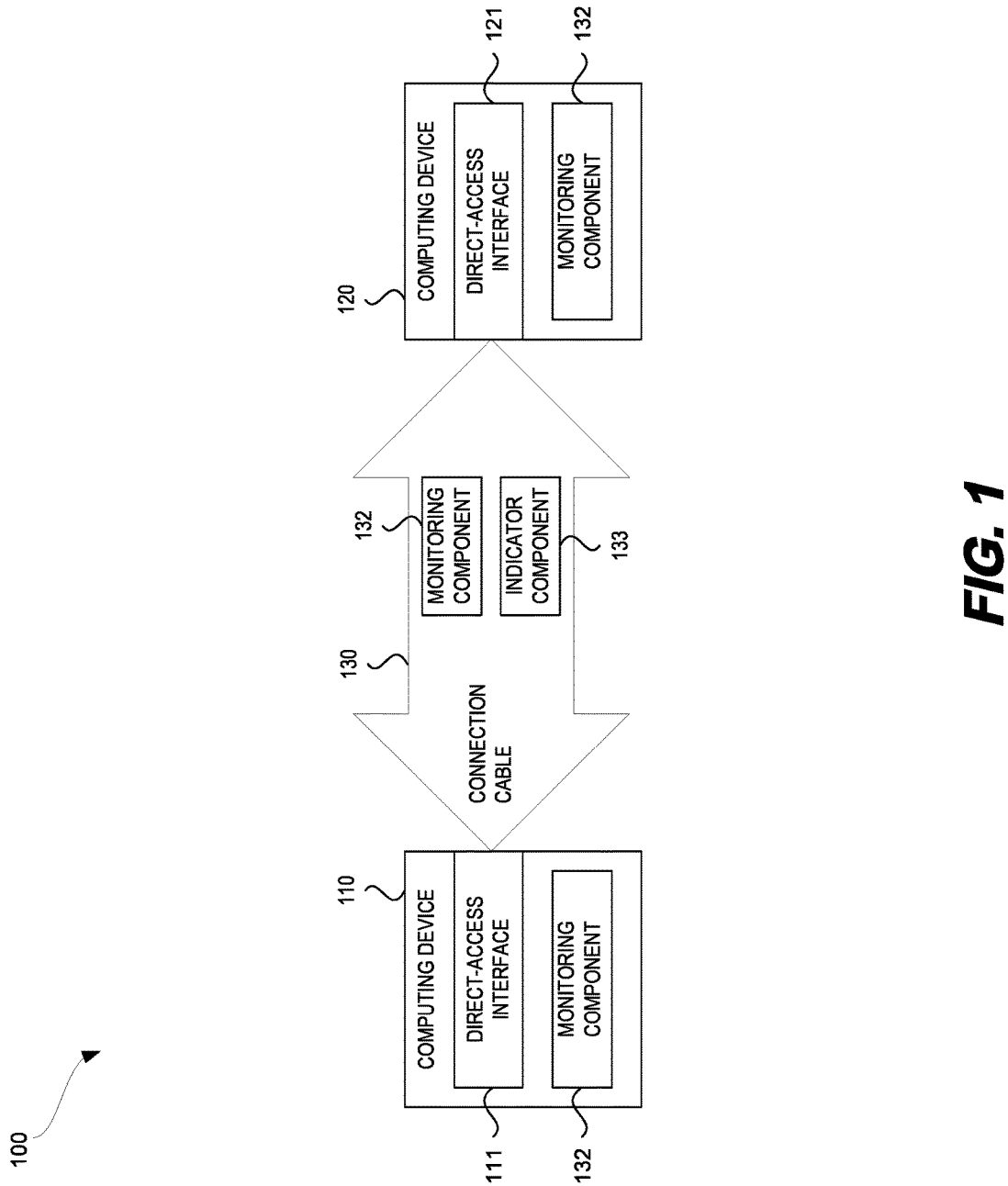
FIG. 1 is a diagram of example computing devices and an example connection cable, according to an embodiment.

While certain embodiments are described, these embodiments are presented by way of example only and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

The headings provided herein are for convenience only and do not necessarily affect the scope or meaning of the claimed invention. Disclosed herein are examples, implementations, configurations, and/or embodiments relating to determining an amount of power received by a connection cable.

Overview

As discussed above, a connection cable (e.g., a Thunderbolt cable, an external serial advanced technology attachment (eSATA) cable, a universal serial bus (USB) cable, etc.) may couple two computing devices (e.g., laptop computers, tablet computers, smartphones, digital cameras, etc.) together and/or may couple a computing device to a power source (e.g., a power adaptor). The computing devices may communicate data with each other via the connection cable. The computing devices may also receive power (e.g., an input voltage) from a power source via the connection cable. Although a computing device may receive power from a power source (e.g., another computing device, a power adaptor, etc.), users may be unable to determine the amount of power (e.g., the voltage level) received via the connection cable. Users may also be unable to determine which connector of the connection cable is a current source and which connector of the connection cable is a current sink. In addition, although computing devices may communicate data via a connection cable, users may be unable to determine the protocol (e.g., type) of the data that is communicated via the connection cable.

Certain embodiments disclosed herein provide the ability to determine an input voltage level of an input voltage received by a connection cable. The connection cable may couple two computing devices together, or may couple a computing device to a power source (e.g., a power adaptor). The connection cable may include a monitoring component to determine whether the input voltage level matches one of a plurality of voltage levels. The monitoring component may also determine which connector of the connection cable is a current source, and which connector of the connection cable is a current sink. The monitoring component may further determine the protocol of data communicated via the connection cable. The connection cable may include an indicator component (e.g., one or more light-emitting diodes (LEDs), a liquid crystal display (LCD), etc.). The indicator component may indicate which of the plurality of voltage levels matches the input voltage level. The indicator component may also indicate which connector of the connection cable is a current source, and/or which connector of the connection cable is a current sink. The indicator component may further indicate the protocol (e.g., type) of data communicated via the connection cable.

Computing Devices

FIG. 1 is a diagram of example computing devices 110, 120, and an example connection cable 130, according to an embodiment. Examples of computing devices may include, but are not limited to, phones (e.g., smart phones, cellular phones, etc.), cable set-top boxes, smart TV's, video game consoles, laptop computers, tablet computers, desktop computers, media players (e.g., portable music players), cameras (e.g., digital cameras), wearable computing devices (e.g., smart watches), data storage devices (e.g., a direct-attached storage (DAS) device, a network-attached storage (NAS) device), and/or other types of electronic devices. The computing devices 110 and 120 may also be referred to as host systems.

In one embodiment, the computing devices 110 and 120 may include processing devices that may be configured to execute instructions and/or perform operations. For example, the computing device 110 may include a central processing unit (CPU), an application-specific integrated circuit (ASIC), a field-programmable gate array (FPGA), a controller, a processor, etc. The computing devices 110 and 120 may also include various types of memory and/or storage media/medium, such as volatile memory (e.g., random-access memory (RAM)) or non-volatile memory (e.g., magnetic media, solid-state media, etc.).

In one embodiment, a computing device may be a data storage device that may provide other computing devices with access to various types of user data stored on the data storage device. The data storage device may also allow users to store various types of user data on the data storage device. The data storage device may comprise magnetic media, hard disk media, and/or solid-state media. For example, the data storage device may include magnetic rotating media that include one or more heads actuated radially over the magnetic rotating media. In another example, the data storage device may include flash memory. While certain description herein may refer to solid state memory generally, one having ordinary skill in the art understands that solid state memory may comprise one or more of various types of solid state non-volatile memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, electrically erasable programmable read-only memory (EEPROM), Ferroelectric Memory (FeRAM), Magnetoresistive RAM (MRAM), other discrete NVM (non-volatile memory) chips, or any combination thereof.

Computing device 110 includes a direct-access interface 111, and computing device 120 includes a direct-access interface 121. A direct-access interface may be an interface (e.g., a port) that allows a computing device to be directly coupled to another computing device and/or a power source. For example, the direct-access interface 111 may be a USB port that allows the computing device 110 to be directly coupled to computing device 120 (via the connection cable 130).

As illustrated in FIG. 1, the connection cable 130 may physically connect the computing devices 110 and 120. For example, the connection cable 130 may be a USB type-C cable that may directly couple the computing device 110 (e.g., a laptop computer) to the computing device 120 (e.g., a smartphone). This may allow the computing devices 110 and 120 to communicate data. This may also allow computing device 110 to provide power to computing device 120, or vice versa. The connection cable 130 may also physically connect a computing device to a power source (not illustrated in FIG. 1). For example, the connection cable 130 may couple a computing device (e.g., a tablet computer) to a power source (e.g., a power adaptor).

The connection cable 130 includes a monitoring component 132 and an indicator component 133. In one embodiment, the monitoring component 132 may not be located in the connection cable 130. Instead, the monitoring component 132 may be located on one or more of the computing devices 110 and 120, as illustrated in FIG. 1. The monitoring component 132 may perform the same functions, operations, methods, and/or actions (described herein) regardless of whether the monitoring component 132 is located on computing device 110, computing device 120, or connection cable 130. In one embodiment, the monitoring component 132 may include processing devices, circuits, modules, software, hardware, firmware, and/or other components to perform various functions, operations, methods, and/or actions discussed herein.

In one embodiment, the connection cable 130 may include one or more data lines (e.g., one or more wires, traces, pins, etc.) that allow the computing device 110 to communicate data with the computing device 120, and vice versa. For example, the connection cable 130 may include data lines (not shown in FIG. 1) that the computing device 110 may use to receive data from and/or transmit data to the computing device 120. In another embodiment, the computing device 110 may provide an input voltage to the computing device 120. The computing device 120 may use the input voltage to operate one or more components of the computing device 120 (e.g., a storage medium, a processing device, a motor, etc.), and/or charge the computing device 120 (e.g., charge a battery of the computing device 120). The connection cable 130 may include one or more voltage lines (e.g., wires, traces, pins, etc.) that may receive the input voltage from the computing device 110 and provide the input voltage to the computing device 120.

The connection cable 130 may include multiple connectors (e.g., cable ends, connectors, plugs, etc.), as discussed in more detail below. A first connector of the connection cable 130 may be coupled to the direct-access interface 111 (of the computing device 110), and a second connector of the connection cable 130 may be coupled to the direct-access interface 121 (of the computing device 120). For example, the first connector may be a USB connector that is coupled to a USB port of the computing device 110.

In one embodiment, the monitoring component 132 may determine whether an input voltage level of an input voltage received by the connection cable 130 matches one of a plurality of voltage levels. For example, the connection cable 130 may receive the input voltage from the computing device 110. The monitoring component 132 may determine whether the input voltage level of the input voltage (received from the computing device 110) matches one of the plurality of voltage levels. In another embodiment, the indicator component 133 may indicate which of the plurality of voltage levels matches the input voltage level, when the input voltage level matches one of the plurality of voltage levels. For example, the indicator component 133 may include LEDs, LCDs, and/or other (visual or audio) indicators that may be used to indicate the voltage level (of the plurality of voltage levels) that matches the input voltage level.

In one embodiment, the monitoring component 132 may determine a current source and a current sink. For example, the monitoring component 132 may determine which connector of the connection cable 130 is receiving the input voltage (e.g., is the current source) and which connector of the connection cable is outputting input voltage (e.g., is the current sink). The monitoring component 132 may also determine the direction of a current that is flowing through the connection cable 130. In another embodiment, the indicator component 133 may indicate which connector of the connection cable 130 is a current source and/or which connector of the connection cable 130 is a current sink. For example, the indicator component may include an LED that may indicate that one of the connectors is the current source.

In one embodiment, the monitoring component 132 may determine a data protocol of data communicated via the connection cable 130. For example, the monitoring component 132 may analyze data (e.g., messages, packets, frames, etc.) communicated (e.g., transmitted/received) between the computing device 110 and the computing device 120 (via one or more data lines of the connection cable 130). The monitoring component 132 may determine that the data is communicated using the peripheral component interconnect express (PCI-e) protocol. In another embodiment, the indicator component 133 may indicate the communication protocol of data communicated via the connection cable 130.

For example, the indicator component 133 may include an LED that may indicate the communication protocol.

In one embodiment, the monitoring component 132 may be configured to determine whether an input voltage received by the connection cable 130 is less than a specified voltage (e.g., a requested voltage). For example, computing device 120 may request the specified voltage (e.g., 20 volts) from the computing device 110 by transmitting one or more messages (or other data/signals) to the computing device 110. The computing device 110 may not provide the specified voltage to the computing device 120 (via the connection cable 130) and may provide a smaller voltage (e.g., 10 volts). For example, the computing device 110 may be unable and/or unwilling to provide the specified voltage. The computing device 110 may transmit one or more messages (or data/signals) indicating the voltage that the computing device 110 may be willing and/or able to provide. The monitoring component 132 may monitor and/or analyze the messages (exchanged between the computing device 110 and the computing device 120) to determine that the input voltage received by the connection cable 130 is less than the specified voltage. In another embodiment, the indicator component 132 may indicate that the input voltage is less than the specified voltage. For example, the indicator component 132 may include multiple LEDs that may be used to indicate the input voltage level and the specified voltage level.

In one embodiment, the monitoring component 132 and the indicator component 133 may be located in a first connector of the connection cable 130 (e.g., a first end, a first head, a first plug, etc.). In another embodiment, the connection cable 130 may include multiple monitoring components and multiple indicator components (not illustrated in FIG. 1), as discussed in more detail below. For example, the connection cable may include a first monitoring component and a first indicator component (located in a first connector) and a second monitoring component and a second indicator component (located in a second connector).

In one embodiment, the monitoring component 132 and/or the indicator component 133 may allow a user to determine the amount of power received via the connection cable 130, more easily, quickly, and/or efficiently. In another embodiment, the monitoring component 132 and/or the indicator component 133 may allow a user to determine a current source and/or a current sink, more easily, quickly, and/or efficiently. In a further embodiment, the monitoring component 132 and/or the indicator component 133 may allow a user to determine a data protocol of data communicated via the connection cable, more easily, quickly, and/or efficiently.

Although the present disclosure may refer to various types of interfaces (e.g., USB, Thunderbolt, Lightning, etc.) and communication protocols (e.g., PCI-e), one having ordinary skill in the art understands that the examples, implementations, and/or embodiments disclosed herein may be applicable to any type of interface and/or communication protocol.

Connection Cables

Figure 2A:
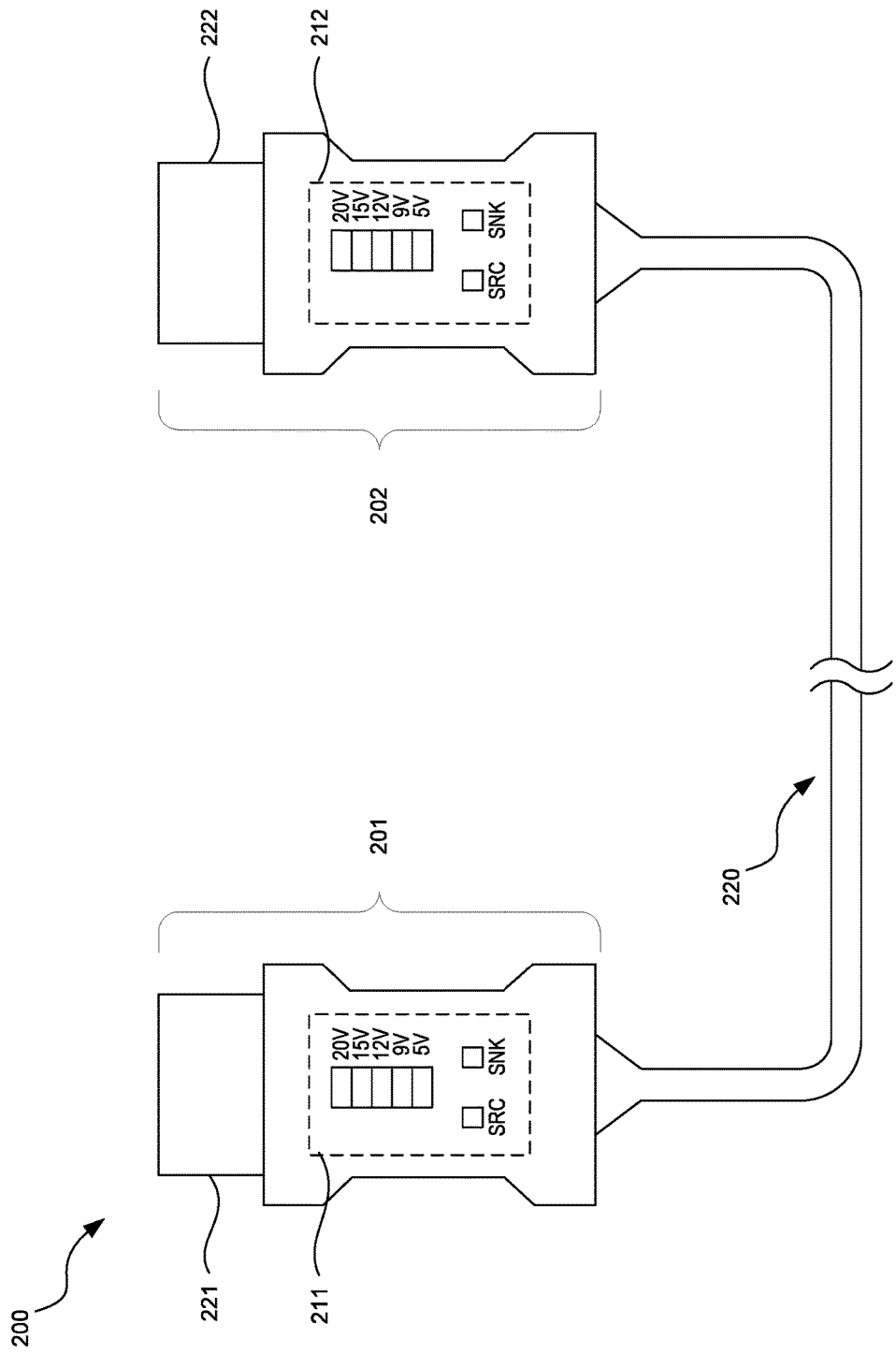
FIG. 2A is a diagram of an example connection cable, according to an embodiment.

FIG. 2A is a diagram of an example connection cable 200, according to an embodiment. The connection cable 200 may physically connect two computing devices (e.g., a laptop computer and a smart phone, a desktop computer and a DAS device, etc.), as discussed above. The connection cable 200 may also physically connect a computing device to a power source, as discussed above. The connection cable 200 of FIG. 2A may represent an embodiment of a connection cable 130 illustrated in FIG. 1. Although a particular embodiment of a connection cable 200 is depicted in FIG. 2A, one having ordinary skill in the art understands that connection cables as described herein may include one or more features of the connection cable 200 described below, while being embodied in a form other than that illustrated in FIG. 2A. For example, the connection cable may have a different size, shape and/or form than that illustrated in FIG. 2A.

In one embodiment, the connection cable 200 includes a first connector 201, a second connector 202, and cable portion 220. The first connector 201 includes a first communication interface 221 and a monitoring component 211. The first connector 201 also includes an indicator component illustrated by the LEDs that are labelled "20V," "15V," "12V," "9V," "5V," "SRC," and "SNK." The second connector 202 includes a second communication interface 222 and a monitoring component 212. The second connector 202 also includes an indicator component illustrated by the LEDs that are labelled "20V," "15V," "12V," "9V," "5V," "SRC," and "SNK." The communications interfaces 221 and 222 may also be referred to as plugs or heads. The cable portion 220 may include one or more data lines (e.g., pins, wires, traces, etc.), and/or one or more power lines (e.g., pins, wires, traces, etc.). The one or more data lines and/or the one or more power lines may couple the communication interface 221 to the communication interface 222.

As illustrated in FIG. 2A, the connection cable 200 includes monitoring component 211 and monitoring component 212. In one embodiment, monitoring component 211 and monitoring component 212 may perform similar (if not identical) functions, operations, methods, and/or actions. For example, monitoring component 211 and/or monitoring component 212 may each determine whether an input voltage level matches one of a plurality of voltage levels, determine whether the input voltage is less than a specified voltage, determine a data protocol of data communicated via the connection cable 200, determine a current source and/or a current sink, etc.

In one embodiment, the communication interfaces 221 and 222 may include serial bus interfaces such as USB and/or SATA interfaces. For example, the communication interface 221 may be a USB type-A plug, and communication interface 222 may be a USB type-C plug. In another example, the communication interface 221 may be a USB type-A plug and the communication interface 222 may be a Lightning plug. One having ordinary skill in the art understands that the communication interfaces 221 and 222 may include various different types of plugs, and/or heads. Other examples of types of plugs include, but are not limited to, a Thunderbolt plug, a USB type-B plug, a USB mini-A plug, a USB mini-B plug, a USB mini-AB plug, a USB micro-A plug, a USB micro-AB plug, etc. In one embodiment, the communication interfaces 221 and 222 may be configured to be connected to (e.g., plugged into, inserted into) direct-access interfaces of computing devices. For example, communication interface 221 may be a USB type-A plug (that may be connected to a USB port on a laptop computer), and communication interface 222 may be a USB type-C plug (that may be connected to a USB port on a smartphone).

As discussed above, the connection cable 200 may receive power from a power source and may provide the power to a computing device (or a battery) via one or more power lines. The monitoring component 211 may determine the input voltage level of an input voltage level received by the connection cable 200, as discussed above. The monitoring component 211 may also determine whether the input voltage level matches one of a plurality of voltage levels. For example, the plurality of voltage levels may include 20 volts (V), 15V, 12V, 9V, and 5V. The monitoring component 211 may determine whether the input voltage level matches one of 20V, 15V, 12V, 9V, and 5V. When the input voltage level matches one of the plurality of voltage levels, the monitoring component 211 may cause the indicator components (e.g., the LEDs) to indicate which of the plurality of voltage levels matches the input voltage level. For example, if the input voltage level is 15V, the monitoring component 211 (or the monitoring component 212) may cause the LED (on the connector 201 and/or connector 202) labeled "15V" to light up, blink, flash, emit a certain color (e.g., red, green, blue, yellow), etc.

Also as discussed above, the monitoring component 211 may determine whether the connector 201 is a receiving a voltage (e.g., whether the connector 201 is a current source) or outputting a voltage (e.g., whether the connector 201 is a current sink). The monitoring component 211 may cause the LED labeled "SRC" (on the connector 201) to light up when the connector 201 is a current source. The monitoring component 211 (or the monitoring component 212) may also cause the LED labeled "SNK" (on the connector 202) to light up when the connector 201 is a current source (and the connector 202 is a current sink).

As discussed above, the monitoring component 211 may be configured to determine whether an input voltage received by the connection cable 200 is less than a specified voltage (e.g., a requested voltage). When the input voltage received by the connection cable is less than the specified voltage, the monitoring component 211 may cause the LEDs on connector 201 and/or connector 202 to indicate that the input voltage received by the connection cable 200 is less than the specified voltage. For example, if the specified voltage was 20V and the input voltage is 12V, the monitoring component 211 may cause the LED labelled "20V" (on connector 201) to blink red and the LED labelled "12V" (on connector 201) to blink green. In another example, if the specified voltage was 20V and the input voltage is 12V, the monitoring component 211 may cause the LED labelled "12V" to blink red (to indicate that the input voltage of 12V is less than the specified voltage of 20V).

In one embodiment, the communication interfaces 221 and 222 may also communicate data between computing devices via one or more data lines of the connection cable 200, as discussed above. For example, two computing devices may transmit/receive data via the communication interfaces 221 and 222, and via the one or more data lines. This may allow a first computing device to access data stored on a second computing device (e.g., a DAS device). The data may be communicated at various speeds (e.g., data transfer speeds). For example, the connection cable 200 may provide data transfer speeds of approximately 3.2 Gbits/s or greater. In another example, the connection cable 200 may provide data transfer speeds of approximately 10 Gbits/s. In a further example, the connection cable 200 may provide data transfer speeds according to a USB 2.X and/or USB 3.X protocol.

Although example LEDs are illustrated in FIG. 2A, one having ordinary skill in the art understands that different numbers, configurations, placements, and/or layouts of LEDs may be used in different embodiments. In addition, the LEDs may blink in different patterns and/or may emit different colors in other embodiments. Furthermore, although two monitoring components and two indicator components (e.g., two sets of LEDs) are illustrated in FIG. 2A, one having ordinary skill in the art understands that fewer/more monitoring components and/or indicator components may be used in the connection cable 200. Further, one having ordinary skill in the art understands that a single monitoring component may control multiple indicator components (e.g., may cause LEDs for multiple indicator components to light up), and a single indicator component may be controlled by multiple monitoring components.

Figure 2B:
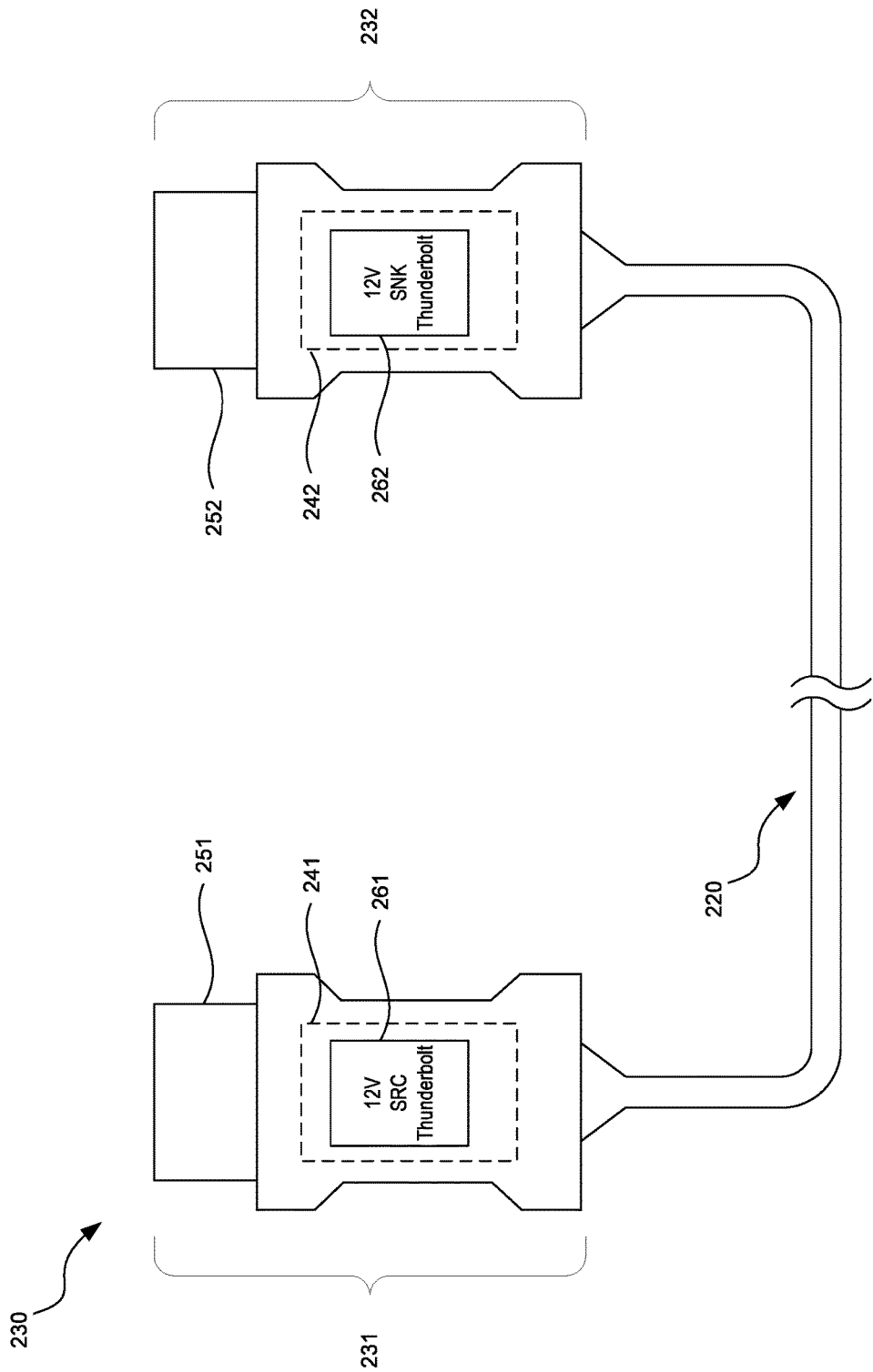
FIG. 2B is a diagram of an example connection cable, according to an embodiment.

FIG. 2B is a diagram of an example connection cable 230, according to an embodiment. The connection cable 230 may physically connect two computing devices (e.g., a laptop computer and a smart phone, a desktop computer and a DAS device, etc.), as discussed above. The connection cable 230 may also physically connect a computing device to a power source, as discussed above. The connection cable 230 of FIG. 2B may represent an embodiment of a connection cable 130 illustrated in FIG. 1. Although a particular embodiment of a connection cable 230 is depicted in FIG. 2B, one having ordinary skill in the art understands that connection cables as described herein may include one or more features of the connection cable 230 described below, while being embodied in a form other than that illustrated in FIG. 2B. For example, the connection cable may have a different size, shape and/or form than that illustrated in FIG. 2B.

In one embodiment, the connection cable 230 includes a first connector 231, a second connector 232, and a cable portion 220. The first connector 231 includes a first communication interface 251 and a monitoring component 241. The first connector 231 also includes an indicator component, illustrated by the LCD 261. The second connector 232 includes a second communication interface 252 and a monitoring component 242. The second connector 232 also includes an indicator component, illustrated by the LCD 262. The communications interfaces 251 and 252 may also be referred to as plugs or heads. The cable portion 220 may include one or more data lines (e.g., pins, wires, traces, etc.), and/or one or more power lines (e.g., pins, wires, traces, etc.). The one or more data lines and/or the one or more power lines may couple the communication interface 251 to the communication interface 252.

As illustrated in FIG. 2B, the connection cable 230 includes monitoring component 241 and monitoring component 242. In one embodiment, monitoring component 241 and monitoring component 242 may perform similar (if not identical) functions, operations, methods, and/or actions, as discussed above. In one embodiment, the communication interfaces 251 and 252 may include serial bus interfaces, as discussed above. One having ordinary skill in the art understands that the communication interfaces 251 and 252 may include various different types of plugs and/or heads, as discussed above. In one embodiment, the communication interfaces 251 and 252 may be configured to be connected to (e.g., plugged into, inserted into) direct-access interfaces of computing devices.

As discussed above, the connection cable 230 may receive power from a power source and may provide the power to a computing device (or a battery) via one or more power lines. The monitoring component 241 may determine the input voltage level of an input voltage level received by the connection cable 230, as discussed above. The monitoring component 241 may also determine whether the input voltage level matches one of a plurality of voltage levels. For example, the plurality of voltage levels may include 20V, 15V, 12V, 9V, and 5V. The monitoring component 241 may determine whether the input voltage level matches one of 20V, 15V, 12V, 9V, and 5V. When the input voltage level matches one of the plurality of voltage levels, the monitoring component 241 may cause the LCD 261 (and/or the LCD 262) to indicate which of the plurality of voltage levels matches the input voltage level. For example, the LCD 261 may indicate that the input voltage level is 12V, as illustrated in FIG. 2B.

Also as discussed above, the monitoring component 241 may determine whether the connector 231 is a receiving a voltage (e.g., whether the connector 231 is a current source) or outputting a voltage (e.g., whether the connector 231 is a current sink). The monitoring component 241 may cause the LCD 261 to display the text "SRC" when the connector 231 is a current source. The monitoring component 241 (or the monitoring component 242) may also cause the LCD 262 to display the text "SNK" when the connector 231 is a current source (and the connector 232 is a current sink).

As discussed above, the monitoring component 241 may be configured to determine whether an input voltage received by the connection cable 230 is less than a specified voltage (e.g., a requested voltage). When the input voltage received by the connection cable is less than the specified voltage, the monitoring component 241 may cause the LCD 261 (and/or the LCD 262) to indicate that the input voltage received by the connection cable 230 is less than the specified voltage. For example, if the specified voltage was 20V and the input voltage is 12V, the monitoring component 241 may cause the LCD to display the text "12V (20V)" to indicate that the input voltage of 12V is less than the specified voltage of 20V.

Also as discussed above, the monitoring component 241 may determine a data protocol of data communicated via the connection cable 230. For example, the monitoring component 241 may analyze data (e.g., messages, packets, frames, etc.) communicated (e.g., transmitted/received) between two computing devices (via the one or more data lines of the connection cable 230). The monitoring component 241 (and/or the monitoring component 242) may determine that the data is communicated using the Thunderbolt protocol. The monitoring component 241 (and/or the monitoring component 242) may cause the LCD 261 (and/or the LCD 262) to display the text "Thunderbolt" to indicate that the data is communicated using the Thunderbolt protocol. The data communicated via the connection cable 230 may be communicated at various speeds (e.g., data transfer speeds), as discussed above.

Although example text is illustrated in the LCDs 261 and 262 of FIG. 2B, one having ordinary skill in the art understands that various alphanumeric characters, symbols, icons, pictures, images, etc., may be used. In addition, although two monitoring components and two LCDs are illustrated in FIG. 2B, one having ordinary skill in the art understands that fewer/more monitoring components and/or LCDs may be used in the connection cable 230. Further, one having ordinary skill in the art understands that a single monitoring component may control multiple LCDs (e.g., may cause text to be displayed in multiple LCDs), and a single LCD may be controlled by multiple monitoring components.

Figure 3:
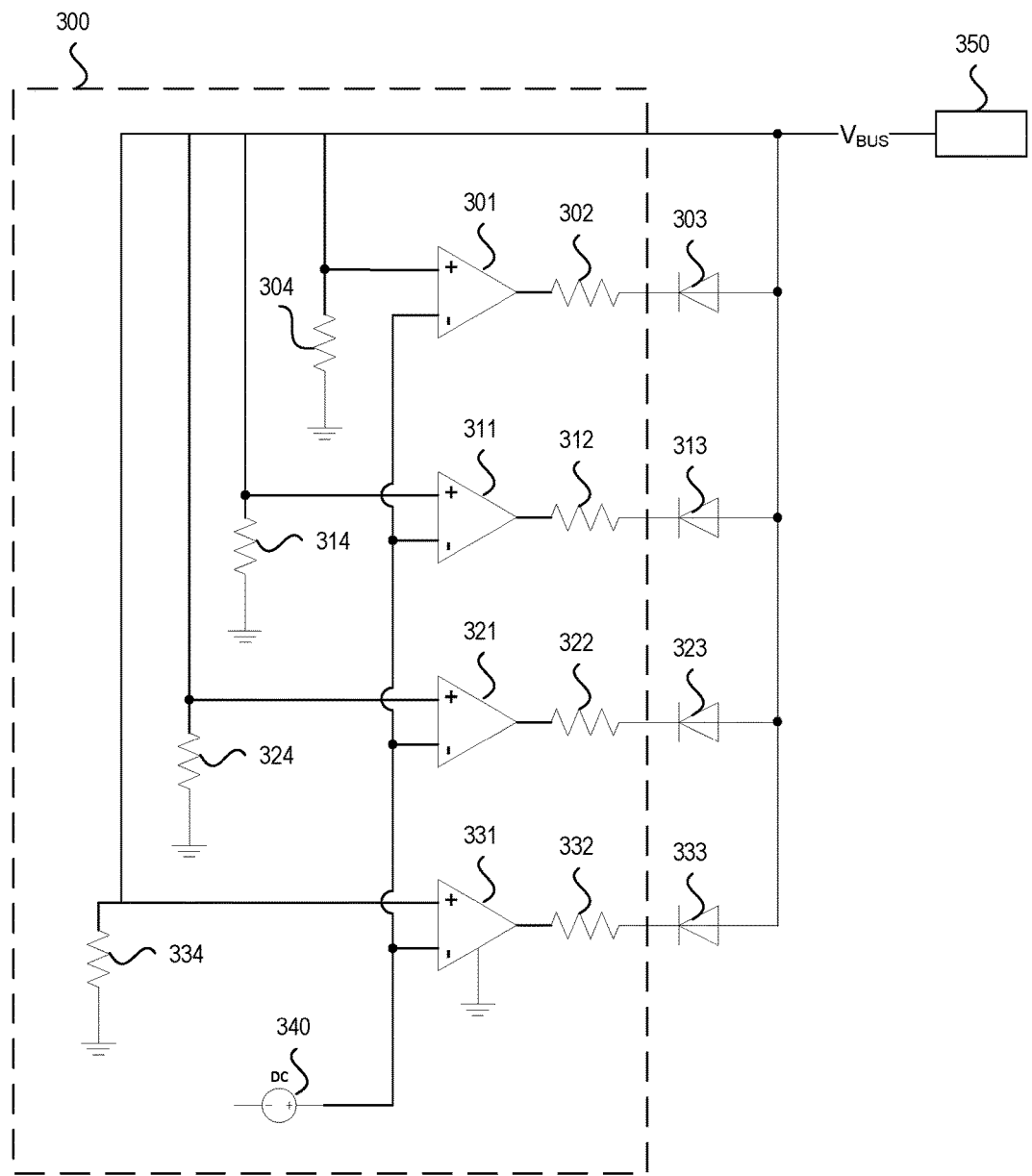
FIG. 3 is a diagram of an example monitoring component, according to an embodiment.

FIG. 3 is a diagram of an example monitoring component 300, according to an embodiment. The monitoring component 300 of FIG. 3 may represent an embodiment of the monitoring components illustrated in FIGS. 1, 2A, and 2B. The monitoring component 300 includes comparators 301, 311, 321, and 331; resistors 302, 304, 312, 314, 322, 324, 332, and 334; and a reference voltage source 340. The comparator 301 is coupled to the reference voltage source 340, an input voltage source 350, and the resistors 304 and 302. The resistor 302 is coupled to the LED 303. The comparator 311 is coupled to the reference voltage source 340, the input voltage source 350, and the resistors 314 and 312. The resistor 312 is coupled to the LED 313. The comparator 321 is coupled to the reference voltage source 340, the input voltage source 350, and the resistors 324 and 322. The resistor 332 is coupled to the LED 323. The comparator 331 is coupled to the reference voltage source 340, the input voltage source 350, and the resistors 334 and 332. The resistor 332 is coupled to the LED 333. The comparator 331, and the resistors 304, 314, 324, and 334 are coupled to ground. In one embodiment, the LEDs 303, 313, 323, and 333 may be part of an indicator component (as discussed above). The LEDs 303, 313, 323, and 333 are coupled to the input voltage $V_{BUS}$.

The comparators 301, 311, 321, and 331 may be examples of comparison components. A comparison component may be any combination of devices, circuits, modules, components, etc., that may be used to compare two or more voltages. The resistance values (e.g., the electrical resistance) of the resistors 302, 304, 312, 314, 322, 324, 332, and 334 may or may not be the same. For example, resistor 302 may be a 2.2K ohm resistor, and resistor 304 may be a 100K ohm resistor.

The monitoring component 300 may receive an input voltage $V_{BUS}$ provided by the input voltage source 350. As discussed above, the input voltage source 350 may be a client device (e.g., a computing device such as a laptop computer, a desktop computer, a cable set-top box, etc.) or a power supply (e.g., an alternating current (AC) adapter, a direct current (DC) adapter, etc.). The input voltage $V_{BUS}$ may be provided by a communication interface of the computing device. For example, the input voltage $V_{BUS}$ may be received from a USB port of the computing device. The monitoring component 300 may provide the input voltage $V_{BUS}$ to the comparators 301, 311, 321, and 331. The input voltage $V_{BUS}$ is also provided to the LEDs 303, 313, 323, and 333.

The reference voltage source 340 may be one or more of a circuit, a component, a module, a device, etc., that may generate one or more reference voltages. The reference voltage source 340 may provide the one or more reference voltages to the comparators 301, 311, 321, and 331. For example, the reference voltage source 340 may generate a first reference voltage for the comparator 301, a second reference voltage for the comparator 311, a third reference voltage for the comparator 321, and a fourth reference voltage for the comparator 331. The comparators 301, 311, 321, and 331 may compare the voltage $V_{BUS}$ with one of the reference voltages generated by the reference voltage source 340. For example, the comparator 301 may compare the first reference voltage with the voltage $V_{BUS}$, the comparator 311 may compare the second reference voltage with the voltage $V_{BUS}$, etc. The comparators 301, 311, 321, and 331 may produce a signal having a logic high state (e.g., a "1") when the input voltage $V_{BUS}$ is greater than a reference voltage. For example, the comparator 311 may produce a signal having a logic high state when the input voltage $V_{BUS}$ is higher than the second reference voltage. The comparators 301, 311, 321, and 331 may produce a signal having a logic low state (e.g., a "0") when the input voltage $V_{BUS}$ is less than a reference voltage. For example, the comparator 311 may produce a signal having a logic low state when the input voltage $V_{BUS}$ is less than the second reference voltage.

In one embodiment, when a comparator produces a signal having a logic high state, the LED coupled to the comparator may emit light (e.g., may light up). For example, if the comparator 301 produces a signal having a logic high state, the LED 303 may emit light. In another embodiment, when a comparator produces a signal having a logic low state, the LED coupled to the comparator may not emit light. For example, if the comparator 301 produces a signal having a logic low state, the LED 303 may not emit light.

Figure 4:
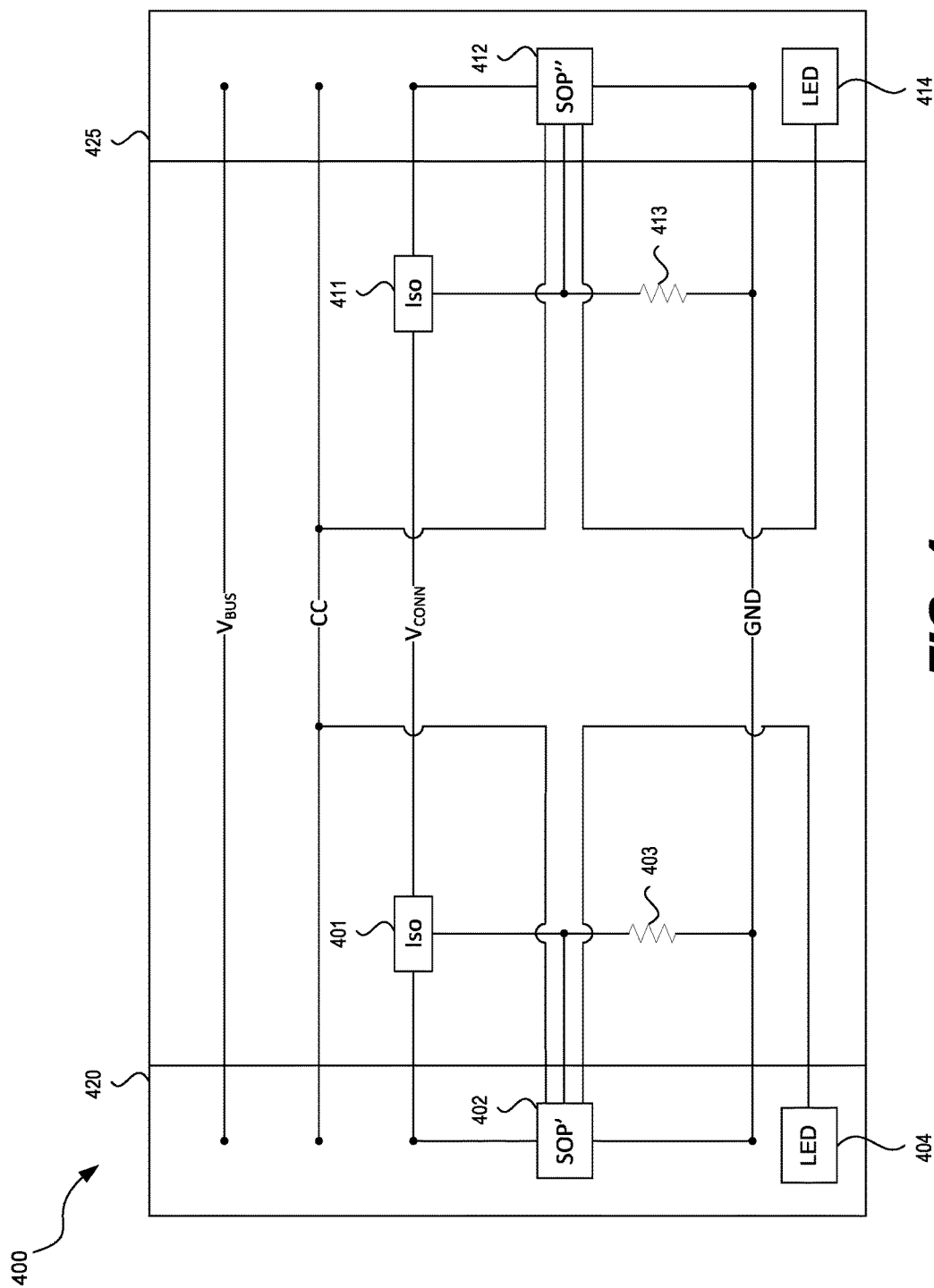
FIG. 4 is a diagram of an example connection cable, according to an embodiment.

FIG. 4 is a diagram of an example connection cable 400, according to an embodiment. The connection cable includes a first connector 420, a second connector 425, a $V_{BUS}$ line (e.g., one or more power lines), a control channel (CC) line, a $V_{CONN}$ line (e.g., one or more power lines), a ground (GND) line, an isolation (Iso) component 401, an isolation (Iso) component 411, a LED 404, a LED 414, a resistor 403, a resistor 413, a start-of-packet element (SOP') 402, and a start-of-packet element (SOP''') 412. The isolation components 401 and 411 are coupled to the $V_{CONN}$. The isolation components 401 and 411 are also coupled to the GND line via resistors 403 and 413, respectively. The SOP' 402 and the SOP''' 412 are coupled to the $V_{CONN}$ line, the GND line, and the CC line. SOP' 402 is coupled to the isolation component 401 and the resistor 403. SOP''' 412 is coupled to the isolation component 411 and the resistor 413.

As illustrated in FIG. 4, the SOP' 402 and the LED 404 may be located in the first connector 420 (e.g., a first end, a first head, etc.) of the connection cable 400. The SOP''' 412 and the LED 414 may be located in the second connector 425 (e.g., a second end, a second head, etc.) of the connection cable 400. Although two LEDs 404 and 414 are illustrated in FIG. 4, one having ordinary skill in the art understands that more LEDs and/or other indicator components may be included in the connection cable 400 (e.g., in the connectors 420 and 425 of the connection cable 400). The $V_{BUS}$ line, the CC line, the $V_{CONN}$ line, and the GND line may terminate inside of the first connector 420 and the second connector 425. In one embodiment (not shown), the isolation component 401 may be located in the first connector 420, and the isolation component 411 may be located in the second connector 425.

As discussed above, a first computing device and/or a power source may provide the voltage $V_{BUS}$ to the connection cable 400. In one embodiment, the $V_{BUS}$ line may provide the voltage $V_{BUS}$ to a second computing device coupled to the connection cable 400. The connection cable 400 may also receive a voltage $V_{CONN}$ from the first computing device and/or power source. The voltage $V_{CONN}$ may be used to provide power to one or more components of the connection cable 400. For example, the voltage $V_{CONN}$ may be provided to SOP' 402 and SOP''' 412. The isolation components 401 and 411 may prevent the voltage $V_{CONN}$ from being transmitted through the connection cable 400. For example, the isolation components 401 and 411 may prevent the voltage $V_{CONN}$ from being transmitted from the first connector 420 to the second connector 425, and vice versa.

Also as discussed above, the second computing device may request a specified voltage from the first computing device. The second computing device may use the CC line to transmit messages, signals, and/or other data to request the specified voltage. The first computing device may also transmit messages, signals, and/or other data to indicate whether the specified voltage or a different voltage (e.g., a lesser voltage) will be provided, as discussed above. The first computing device may use also use the CC line to transmit the messages, signals, and/or other data.

In one embodiment, the SOP' 402 and/or the SOP''' 412 may each include a monitoring component. The monitoring components of the SOP' 402 and the SOP''' 412 may perform similar (if not identical) actions, functions, methods, and/or operations, as discussed above. For example, the monitoring component (in the SOP' 402 or in the SOP''' 412) may analyze messages, signals, and/or other data, transmitted on the CC line. The monitoring component (in the SOP' 402 or in the SOP''' 412) may determine that the voltage $V_{BUS}$ is less than a specified voltage (e.g., a requested voltage). In another example, the monitoring component (in the SOP' 402 or in the SOP''' 412) may analyze messages, signals, and/or other data (communicated via the CC line) to determine which connector of the connection cable 400 is a current source and which connector of the connection cable is a current sink.

In one embodiment, the monitoring component (in the SOP' 402 or in the SOP''' 412) may cause one or more of the LEDs 404 and 414 to provide different indications. For example, the monitoring component (in the SOP' 402 or in the SOP''' 412) may cause the LED 404 to emit light to indicate that the voltage $V_{BUS}$ is less than a specified voltage. In another example, the monitoring component (in the SOP' 402 or in the SOP''' 412) may cause the LED 414 to emit light to indicate that the second connector (where the LED 414 is located) is a current sink.

Figure 5:
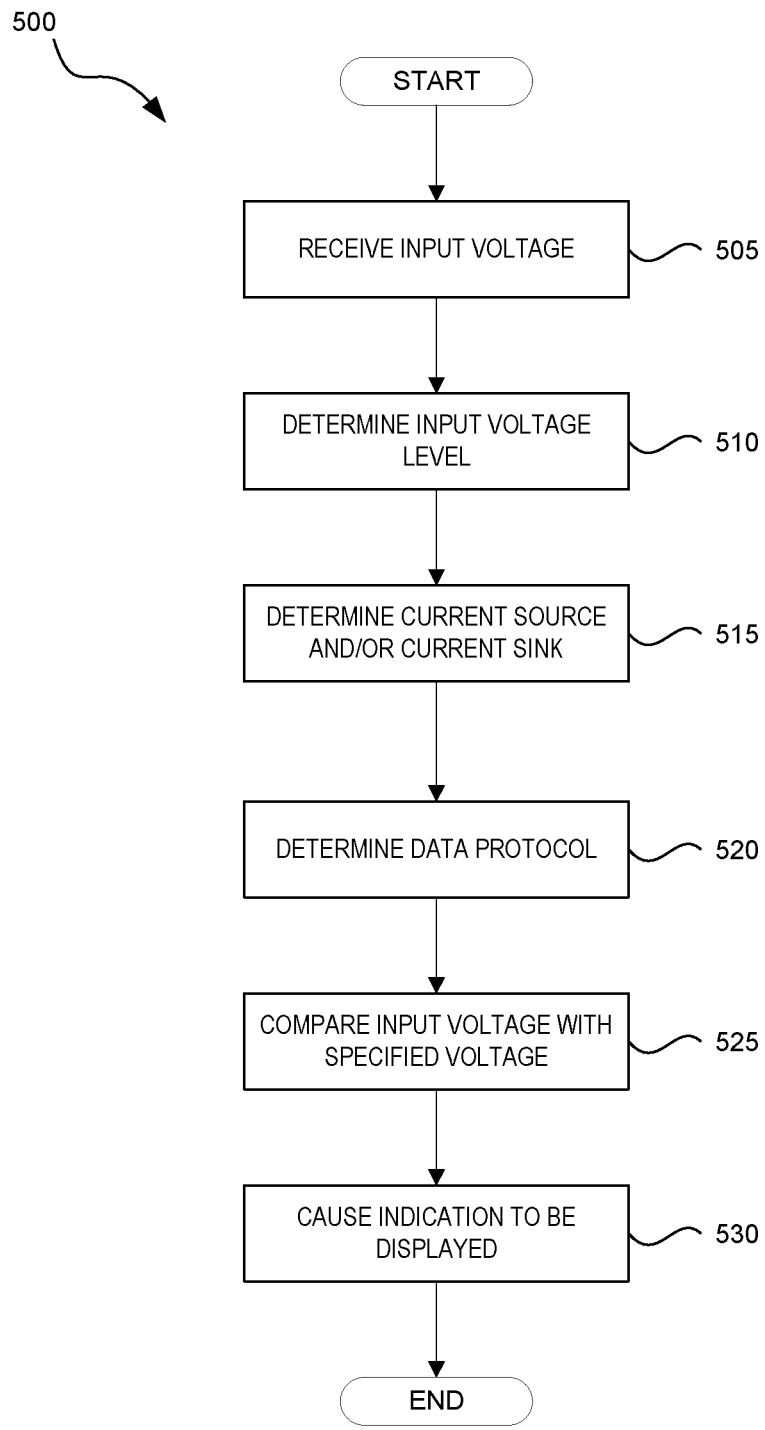
FIG. 5 is a flow diagram illustrating a process for determining an input voltage level, according to an embodiment.

FIG. 5 is a flow diagram illustrating a process for determining an input voltage level, according to an embodiment. The process 500 may be performed by a monitoring component and/or an indicator component, as illustrated and discussed above in conjunction with FIGS. 1-4. The monitoring component and/or an indicator component may be processing logic that includes hardware (e.g., circuitry, dedicated logic, programmable logic, microcode, etc.), software (e.g., instructions run on a processor), firmware, or a combination thereof. The monitoring component may be located in a connection cable and/or a computing device, as discussed above. The indicator component may be located in a connector of the connection cable, as discussed above.

The process 500 begins at block 505 where the process 500 receives an input voltage, as discussed above. For example, the input voltage may be received from a computing device (e.g., a host system) or a power source (e.g., a power adaptor). At block 510, the process 500 determines the input voltage level of the input voltage. In one embodiment, the process 500 may also determine whether the input voltage level matches one of a plurality of voltage levels at block 510, as discussed above. If the input voltage level does not match one of the plurality of voltage levels, the process 500 may end. If the input voltage level does match one of the plurality of voltage levels, the process 500 may optionally proceed to block 515. At block 515, the process 500 may optionally determine a current source and/or a current sink, as discussed above. For example, the process 500 may determine which connector of a connection cable is the current source and which connector of the connection cable is a current sink.

The process 500 may also optionally determine the data protocol of data communicated between computing devices at block 520, as discussed above. For example, the process 500 may analyze the data that is communicated between computing devices. The process 500 may determine that the data is being communicated using the PCI-e protocol.

At block 525, the process 500 may optionally compare the input voltage with a specified voltage, as discussed above. For example, process 500 may compare the input voltage with a specified voltage requested by a computing device.

At block 530, the process 500 may cause various indicators to be displayed on one or more indicator components. For example, the process 500 may cause an indicator component (e.g., an LED, an LCD), to indicate which of the plurality of voltage levels matches the input voltage level. In another example, the process 500 may cause the indicator component to indicate the data protocol if the data protocol is determined at block 520. In a further example, the process 500 may cause the indicator component to indicate that the input voltage is less than the specified voltage, if the input voltage is compared with the specified voltage at block 525. After block 530, the process 500 ends.

Additional Embodiments

Those skilled in the art will appreciate that in some embodiments, other types of systems, devices, and/or apparatuses can be implemented while remaining within the scope of the present disclosure. In addition, the actual steps taken in the processes discussed herein may differ from those described or shown in the figures. Depending on the embodiment, certain of the steps described above may be removed, others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc., as used herein are meant as labels to distinguish among different elements and may not necessarily have an ordinal meaning according to their numerical designation.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A connection cable, comprising:
   a first connector configured to couple the connection cable to a first device, the first connector comprising:
   a first monitoring component configured to determine whether an input voltage level of an input voltage received by the connection cable matches one of a plurality of voltage levels; and
   a first indicator component configured to:
   indicate which of the plurality of voltage levels matches the input voltage level when the input voltage matches one of the plurality of voltage levels; and
   indicate whether the first device is a current source or a current sink;
   a second connector configured to couple the connection cable to a second device, the second connector comprising:
   a second monitoring component configured to determine whether the input voltage level of the input voltage received by the connection cable matches one of the plurality of voltage levels; and
   a second indicator component configured to:
   indicate which of the plurality of voltage levels matches the input voltage level when the input voltage matches one of the plurality of voltage levels; and
   indicate whether the second device is the current source or the current sink.

2. The connection cable of claim 1, wherein the first and second indicator components are further configured to indicate the plurality of voltage levels.

3. The connection cable of claim 1, wherein the first monitoring component is further configured to determine a data protocol of data communicated via the connection cable.

4. The connection cable of claim 3, wherein the first and second indicator components are further configured to indicate the data protocol.

5. The connection cable of claim 1, wherein the first monitoring component comprises a plurality of comparators configured to compare the input voltage with a plurality of reference voltages.

6. The connection cable of claim 5, further comprising:
   a reference voltage source configured to generate the plurality of reference voltages and provide the plurality of reference voltages to the plurality of comparators.

7. The connection cable of claim 1, wherein the first monitoring component is further configured to determine that the input voltage is less than a specified voltage.

8. The connection cable of claim 7, wherein the first indicator component is further configured to indicate that the input voltage is less than the specified voltage.

9. The connection cable of claim 1, further comprising:
   one or more voltage lines configured to receive the input voltage from a voltage source; and
   one or more data lines configured to communicate data with a computing device.

10. The connection cable of claim 9, wherein the computing device comprises the voltage source.

11. The connection cable of claim 1, wherein at least one of the first indicator component and the second indicator component comprises a light-emitting diode (LED).

12. The connection cable of claim 1, wherein at least one of the first indicator component and the second indicator component comprises a liquid crystal display (LCD).

13. The connection cable of claim 1, wherein the connection cable comprises a universal serial bus (USB) type-C cable.

14. A method, comprising:
receiving an input voltage provided via a connection cable, the connection cable comprising a first connector and a second connector;
determining, at both the first connector and the second connector, whether an input voltage level of the input voltage matches one of a plurality of voltage levels;
causing a first voltage indication to be displayed at the first connector when the input voltage matches one of the plurality of voltage levels, wherein the first voltage indication indicates which of the plurality of voltage levels matches the input voltage level;
causing a second voltage indication to be displayed at the second connector when the input voltage matches one of the plurality of voltage levels, wherein the second voltage indication indicates which of the plurality of voltage levels matches the input voltage level;
causing, at the first connector, a first current indication to be displayed that indicates whether the first connector is attached to a current source or a current sink; and
causing a second current indication to be displayed at the second connector that indicates whether the second connector is attached to the current source or the current sink.

15. The method of claim 14, further comprising:
determining a data protocol of data communicated via the connection cable.

16. The method of claim 15, further comprising:
causing a data protocol indication corresponding to the determined data protocol to be displayed on at least one of the first connector and the second connector.

17. The method of claim 14, further comprising:
determining that the input voltage is less than a specified voltage.

18. The method of claim 17, further comprising:
indicating that the input voltage is less than the specified voltage on at least one of the first connector and the second connector.

* * * * *